United States Patent
Hong et al.

(10) Patent No.: US 7,030,635 B2
(45) Date of Patent: Apr. 18, 2006

(54) DEVICE FOR MEASURING SUPPLY VOLTAGE AND METHOD THEREOF

(75) Inventors: Gwan-pyo Hong, Yongin-si (KR); Hyong-yong Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/893,341

(22) Filed: Jul. 19, 2004

(65) Prior Publication Data

US 2005/0104611 A1    May 19, 2005

(30) Foreign Application Priority Data

Nov. 14, 2003    (KR) .............. 10-2003-0080686

(51) Int. Cl.
*G01R 31/02* (2006.01)
(52) U.S. Cl. .................. 324/760; 324/158.1
(58) Field of Classification Search .......... 324/74, 324/103 R, 103 P, 760, 765, 158.1; 702/65–69
See application file for complete search history.

(56) References Cited

U.S. PATENT DOCUMENTS 6,757,627 B1 * 6/2004 Mizuno ................ 702/65
6,798,188 B1 * 9/2004 Dathe et al. .......... 324/103 P

FOREIGN PATENT DOCUMENTS

JP          6-53299       2/1994
JP          2001-35193    2/2001

* cited by examiner

*Primary Examiner*—Minh N. Tang
(74) *Attorney, Agent, or Firm*—Harness, Dickey & Pierce, P.L.C.

(57) ABSTRACT

A device for measuring voltage, including a voltage detecting portion for detecting a plurality of voltages and outputting a maximum voltage of the plurality of voltages, a voltage latching portion that receives a first output from the voltage detecting portion, and a voltage reading portion that receives a second output from the voltage latching portion. Another device for measuring voltage, including a supply voltage, a ground voltage, and first and second supply voltage measuring units connected in parallel to each other between the supply voltage and the ground voltage. A method for measuring voltage, including receiving a plurality of voltages, detecting a maximum voltage from the plurality of voltages, maintaining the detected maximum voltage, and outputting the maintained detected maximum voltage.

24 Claims, 4 Drawing Sheets

DEVICE FOR MEASURING SUPPLY VOLTAGE AND METHOD THEREOF

BACKGROUND OF THE INVENTION

This application claims the priority of Korean Patent Application No. 10-2003-0080686 filed on Nov. 14, 2003, in the Korean Intellectual Property Office, the disclosure of which is incorporated herein by reference in its entirety.

1. Field of the Invention

The present invention relates generally to a device and method for measuring a supply voltage, and more particularly, to a device and method for measuring the maximum value of a plurality of supply voltages during a burn-in test for a semiconductor device.

2. Description of the Related Art

Various tests may be required in order to verify the performance and reliability of a semiconductor device. These tests may lead to increases in the yield of the production of semiconductor devices. A burn-in test is a test which may determine the performance and/or reliability of a semiconductor device by conventional methods. The burn-in test may be a test wherein stress conditions may be applied to a semiconductor device in order to determine whether the semiconductor device may be likely to become defective at an early stage in a fabrication process of the semiconductor device.

By conventional methods, a semiconductor device may be operated under stress conditions. Examples of stress conditions may include forcing the semiconductor to operate with a high supply voltage and/or a high temperature for an extended period of time. Stress conditions may enable defects in the semiconductor device to be determined.

The burn-in test may aid in detecting and screening out defective semiconductor devices. In the burn-in test, an appropriate burn-in stress voltage may be applied to the semiconductor device as an acceleration factor, which may serve to accelerate the rate at which defects in the semiconductor device are determined. An acceleration factor may be a parameter which affects the rate of defect detection in the semiconductor device. A high operating temperature and/or a burn-in stress voltage may be acceleration factors.

With respect to a semiconductor memory device, a magnitude of a voltage of cell data may be an acceleration factor. When the magnitude of a voltage of cell data is at a first logic level (i.e., a high logic level), the magnitude of the voltage of cell data may be a factor in determining a magnitude of a burn-in stress voltage and/or a duration of the burn-in test.

If the burn-in stress voltage is above a threshold voltage, a supply voltage may increase. This increase to the supply voltage may result in an excessive rise of the voltage level in the semiconductor device.

In recent years, semiconductor devices have been fabricated at increasingly smaller sizes. This has enabled metal oxide semiconductor field effect transistors (MOSFETs), formed within semiconductor memory devices, to be reduced in size. The reduction of size of the MOSFETs has led to lower punch-through voltages and thinner gate oxide layers of the MOSFET. With a lower punch-through voltage, there is an increased risk of a MOSFET not being able to fully contain a voltage.

When a high burn-in stress voltage is applied to a semiconductor device, it may be difficult to determine accurate failure causes for the semiconductor device by conventional methods, which may in turn make it difficult to enhance the yield of the semiconductor device. It may not be possible to determine whether device failures are caused due to degradation of devices, progression of initial defects, a punch-through breakdown, and/or gate oxide rupture occurring when a burn-in stress voltage above a threshold voltage is applied to a MOSFET of a semiconductor device by conventional methods.

Conventional circuits exist for detecting whether a burn-in stress voltage applied to a semiconductor memory device exceeds the threshold voltage.

However, detecting whether the burn-in stress voltage exceeds the threshold voltage may not determine accurate failure causes for the semiconductor device. Even with conventional circuits, it may not be possible to determine whether device failures are caused due to degradation of devices, progression of initial defects, a punch-through breakdown, and/or gate oxide rupture occurring when a burn-in stress voltage above a threshold voltage is applied to a MOSFET of a semiconductor device.

SUMMARY OF THE INVENTION

An exemplary embodiment of the present invention is a device for measuring voltage, including a voltage detecting portion for detecting a plurality of voltages and outputting a maximum voltage of the plurality of voltages, a voltage latching portion that receives a first output from the voltage detecting portion, and a voltage reading portion that receives a second output from the voltage latching portion.

Another exemplary embodiment of the present invention is a device for measuring voltage, including a supply voltage, a ground voltage, and first and second supply voltage measuring units connected in parallel to each other between the supply voltage and the ground voltage.

Another exemplary embodiment of the present invention is a method for measuring voltage, including receiving a plurality of voltages, detecting a maximum voltage from the plurality of voltages, maintaining the detected maximum voltage, and outputting the maintained detected maximum voltage.

BRIEF DESCRIPTION OF THE DRAWINGS

The present invention will become more apparent by describing in detail exemplary embodiments thereof with reference to the attached drawings in which.

DETAILED DESCRIPTION OF THE EXEMPLARY EMBODIMENTS OF THE INVENTION

Figure 1:
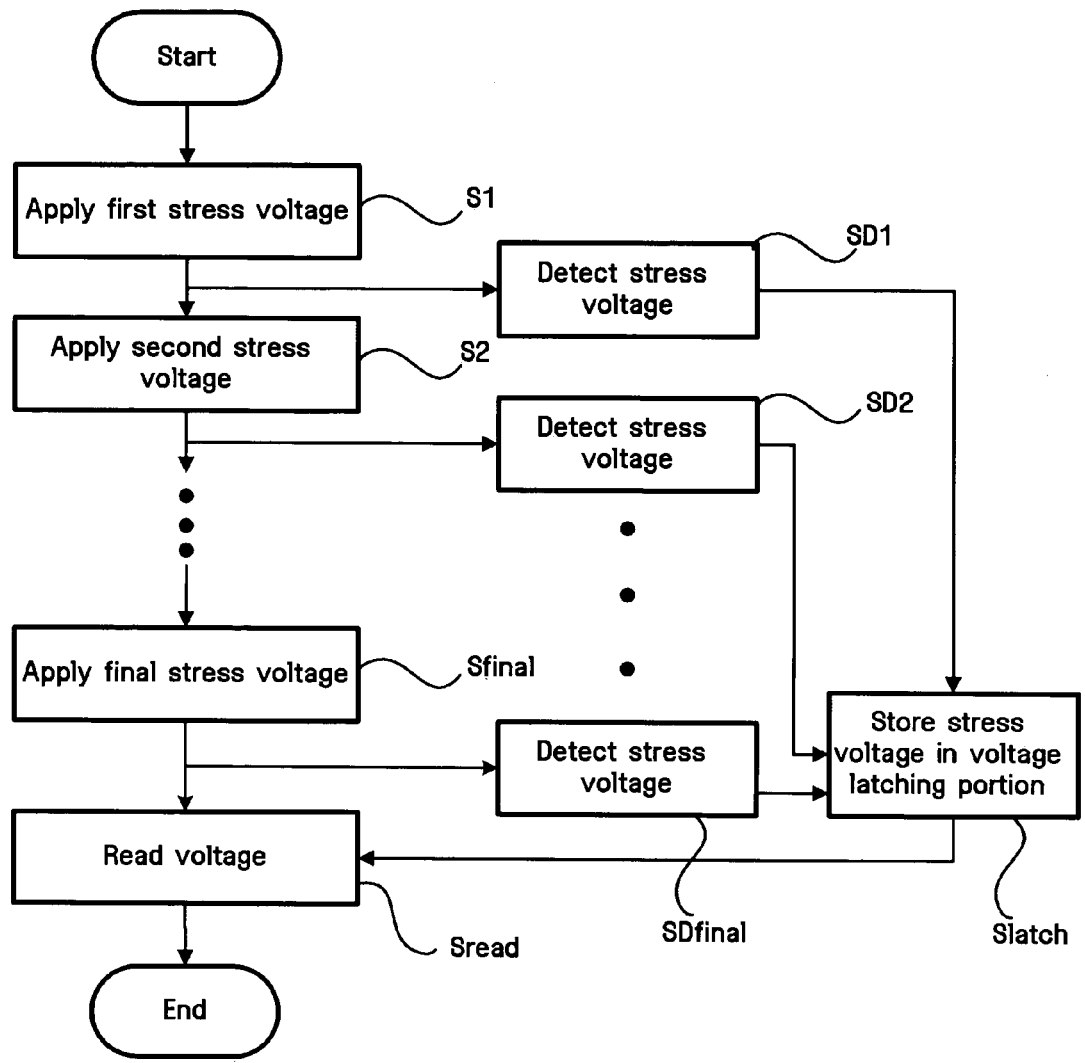
FIG. 1 illustrates a flowchart for measuring a supply voltage of a semiconductor memory device according to an exemplary embodiment of the present invention.

Hereinafter, exemplary embodiments of the present invention will be described in detail with reference to the accompanying drawings.

In the Figures, the same reference numerals are used to denote the same elements throughout the drawings.

FIG. 1 illustrates a flowchart for measuring a supply voltage of a semiconductor memory device according to an exemplary embodiment of the present invention.

In order to perform a burn-in test on a semiconductor memory device, a plurality of burn-in stress voltages may be applied to the semiconductor memory device as shown in S1–Sfinal. The plurality of burn-in stress voltages may be detected in SD1–SDfinal. The detected plurality of burn-in stress voltages may be stored in a latching mechanism as shown in Slatch. A maximum burn-in stress voltage of the stored plurality of burn-in stress voltages in Slatch may be received by Sread.

In another exemplary embodiment of the present invention, a supply voltage measuring device may include a voltage detecting portion, a voltage latching portion, and a voltage reading portion. When a plurality supply voltage levels are applied, the voltage detecting portion may detect a maximum supply voltage level from the plurality of supply voltage levels. The voltage latching portion may then receive an output of the maximum supply voltage level from the voltage detecting portion and may store the received maximum supply voltage level. The voltage reading portion may receive an output of the maximum supply voltage level from the voltage latching portion.

In another exemplary embodiment of the present invention, the voltage detecting portion may detect at least one supply voltage level which does not exceed the maximum supply voltage level. As the number of supply voltage levels increases, the supply voltage levels detected by the voltage detecting portion may become more accurate.

Figure 2:
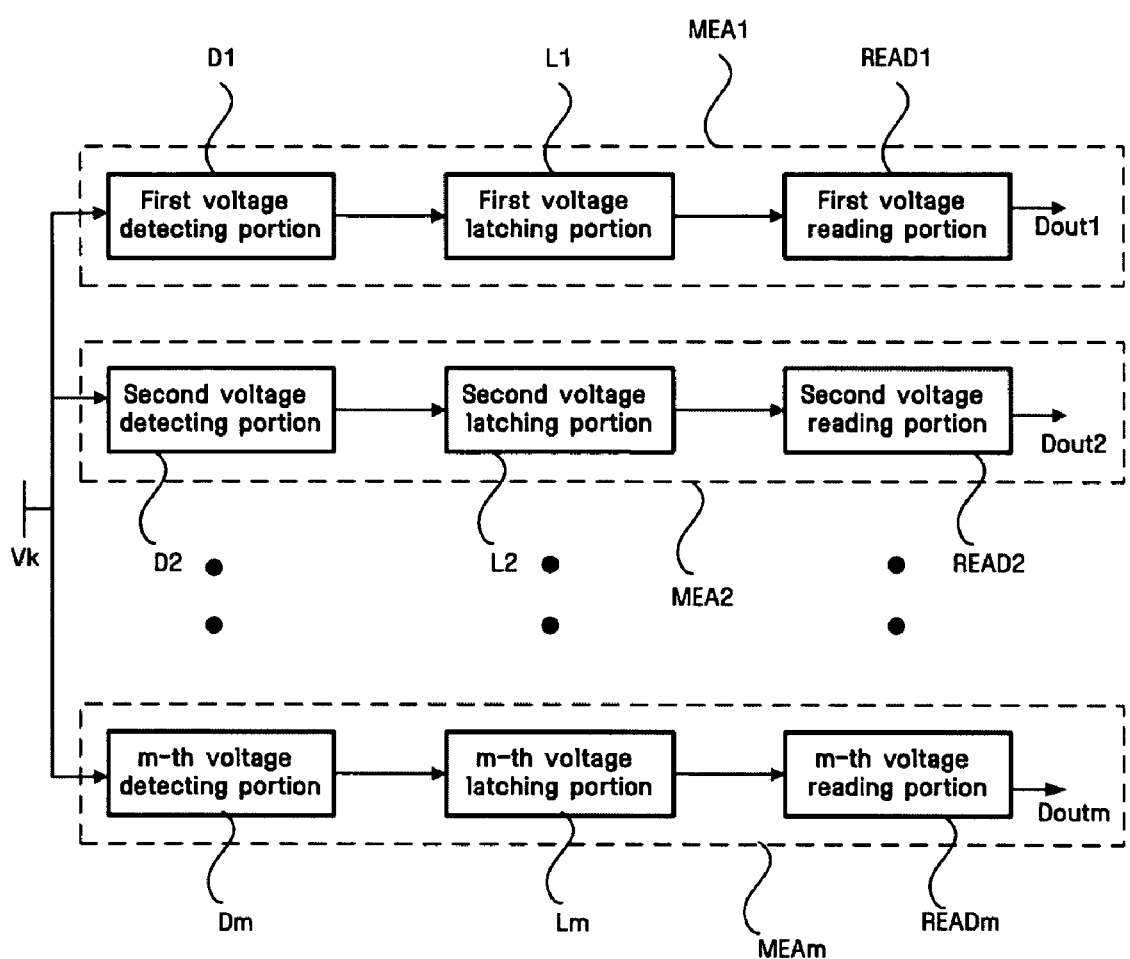
FIG. 2 illustrates a block diagram of a supply voltage measuring device according to an exemplary embodiment of the present invention.

FIG. 2 illustrates a block diagram of a supply voltage measuring device according to an exemplary embodiment of the present invention.

Figure 3A:
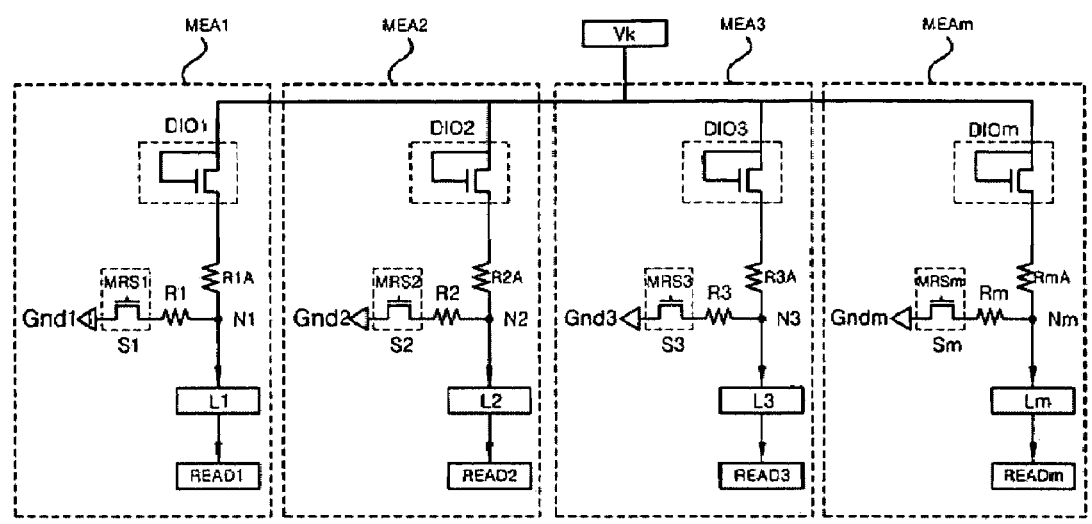
FIG. 3A illustrates a circuit diagram of voltage detecting portions of a plurality of supply voltage measuring units in the supply voltage measuring device according to an exemplary embodiment of the present invention.

FIG. 3A illustrates a circuit diagram of voltage detecting portions of a plurality of supply voltage measuring units in the supply voltage measuring device according to an exemplary embodiment of the present invention.

Figure 3B:
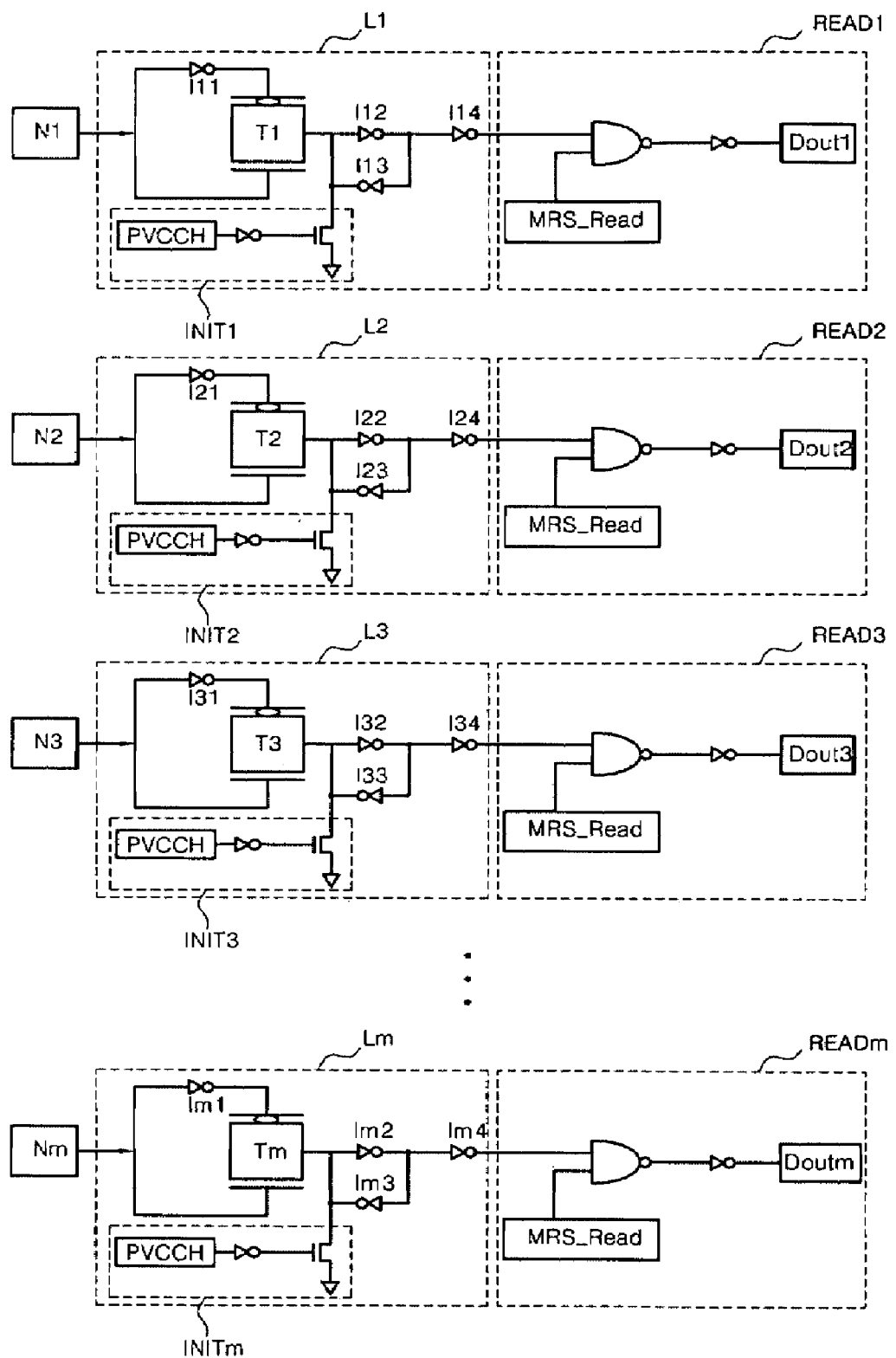
FIG. 3B illustrates a circuit diagram of voltage latching portions and voltage reading portions of the plurality of supply voltage measuring units in the supply voltage measuring device according to an exemplary embodiment of the present invention.

FIG. 3B illustrates a circuit diagram of voltage latching portions and voltage reading portions of the plurality of supply voltage measuring units in the supply voltage measuring device according to an exemplary embodiment of the present invention.

Referring to FIG. 3A, the supply voltage measuring device may include a supply voltage Vk, ground voltages Gnd1–Gndm, and/or a plurality of supply voltage measuring units MEA1–MEAm. The plurality of supply voltage measuring units MEA1–MEAm may be connected in parallel between the supply voltage Vk and the ground voltages Gnd1–Gndm. As shown in FIG. 2, the first supply voltage measuring unit MEA1 may include a first voltage detecting portion D1, a first voltage latching portion L1, and/or a first voltage reading portion READ1.

Referring to FIG. 3A, the first voltage detecting portion D1 may include a first resistor R1A connected between the supply voltage Vk and a first output node N1. The first voltage detecting portion D1 may also include a second resistor R1 connected between the first output node N1 and the ground voltages Gnd1–Gndm. The first voltage detecting portion D1 may reduce the supply voltage Vk based on a resistance ratio between the second resistor R1 and the first resistor R1A as illustrated in FIG. 3A. The first voltage detection portion D1 may output the reduced voltage at the first output node N1. The voltage at the first output node N1 may be adjusted by varying the resistance ratio between the second resistor R1 and the first resistor R1A.

In an example of the above-described exemplary embodiment, it may be assumed that the resistances of the first and second resistors are R1A and R1, respectively, and the supply voltage is Vk. The voltage at the first output node N1 may be determined by Equation 1 as given below:

$$V_{N1} = \frac{Vk \times R1}{R1A + R1} \quad (1)$$

The second supply voltage measuring unit MEA2 may include a second voltage detecting portion D2, a second voltage latching portion L2, and/or a second voltage reading portion READ1. The second voltage detecting portion D2 may include a third resistor R2A connected between the supply voltage Vk and a second output node N2. The second voltage detecting portion D2 may include a fourth resistor R2 connected between the second output node N2 and the ground voltage Gnd1–Gndm. The second voltage detecting portion D2 may reduce the supply voltage Vk based on the resistance ratio between the fourth resistor R2 and the third resistor R2A as illustrated in FIG. 3A. The second voltage detecting portion D2 may output the reduced voltage at the second output node N2. The voltage at the second output node N2 may be adjusted by varying the resistance ratio between the fourth resistor R2 and the third resistor R2A.

In an example of the above-described exemplary embodiment, it may be assumed that the resistances of the third and fourth resistors are R2A and R2, respectively, and the supply voltage is Vk. The voltage at the second output node N2 may be determined by Equation 2 as given below:

$$V_{N2} = \frac{Vk \times R2}{R2A + R2} \quad (2)$$

The resistance ratio between the first and second resistors R1A and R1 may be different from the ratio between the third and fourth resistors R2A and R2. Accordingly, the voltage at the first output node N1 may be different from the voltage at the second output node N2.

In an exemplary embodiment of the present invention, when a burn-in stress voltage is applied as the supply voltage Vk, the first and second voltage detecting portions D1 and D2 may output voltages at the output nodes N1 and N2, respectively, in proportion to their corresponding resistance ratios. The first and second latching portions L1 and L2 may be activated by the voltages at the output nodes N1 and N2, respectively, of the first and second voltage detecting portions. If the voltages at the output nodes N1 and/or N2 are not greater than or equal to a threshold voltage level, the respective voltage latching portions L1 and L2 may not be activated.

In an exemplary embodiment of the present invention, the voltages at output nodes N1 and N2 may increase in order to activate the first and second voltage latching portions L1 and L2 when the maximum voltage of the plurality of burn-in stress voltages is applied. In an exemplary embodiment, the voltages at the output nodes N1 and N2 may be latched to the states of the voltage latching portions L1 and L2, respectively.

In another exemplary embodiment of the present invention, the supply voltage measuring device may include additional supply voltage measuring units. These additional supply voltage measuring units are illustrated in FIG. 2 and 3A as supply voltage measuring units MEA3–MEAm connected in parallel between the supply voltage Vk and ground voltages Gnd3–Gndm, where m may be greater than 4.

In another exemplary embodiment of the present invention, the third supply voltage measuring unit MEA3 may include a third voltage detecting portion D3, a third voltage latching portion L3, and/or a third voltage reading portion READ3. Similarly, the m-th supply voltage measuring unit MEAm may include an m-th voltage detecting portion Dm, an m-th voltage latching portion Lm, and/or an m-th voltage reading portion READm.

In another exemplary embodiment of the present invention, the voltage detecting portions D1–Dm of supply voltage measuring units MEA1–MEAm may include resistors R1A–RmA, wherein each of the resistors R1A–RmA may be connected between the supply voltage Vk and one of the output nodes N1–Nm. Further, each of the resistors R1–Rm may be connected between one of the output nodes N1–Nm and the ground voltages Gnd1–Gndm. Each of the voltage detecting portions D1–Dm may reduce the supply voltage Vk based on the resistance ratio between the resistance ratio of the respective resistances, similar to supply voltage measuring units MEA1 and MEA2 as described in above exemplary embodiments and illustrated in FIG. 3A. The respective voltage detection portions SD1–SDm may output the reduced voltage at respective output nodes N1–Nm. In this manner, the voltage at the output nodes N1–Nm may be adjusted by varying the resistance ratio of the respective resistors.

In an example of the above-described exemplary embodiment, it may be assumed that the resistances of the resistors are RmA and Rm, and the supply voltage is Vk. The voltage at the output node Nm may be determined by Equation 3 as given below:

$$V_{Nm} = \frac{Vks \times Rm}{Ra + Rm} \quad (3)$$

Since voltages at the output nodes N1–Nm may vary based on the resistance ratios of the plurality of voltage detecting portions D1–Dm, the voltage levels at the output nodes N1–Nm may be adjusted by varying the resistance ratios within the plurality of voltage detecting portions D1–Dm.

In another exemplary embodiment of the present invention, the voltages at the output nodes N1–Nm may be adjusted by adjusting the resistance ratios of the plurality of voltage detecting portions D1–Dm to be different from one another. The resistors R1A–RmA may have equivalent resistance values while R1–Rm may have different resistance values.

In another exemplary embodiment of the present invention, the resistors R1–Rm may be arranged in an ascending or descending order of resistance values from the first to the m-th position. This arrangement may increase or decrease the sequential voltages at the output nodes N1–Nm, which may simplify the estimation of the voltage values at the output nodes N1–Nm.

In another exemplary embodiment of the present invention, the number of voltage at the output nodes N1–Nm may be proportional to the number of the voltage detecting portions D1–Dm. As the number of the voltage detecting portions D1–Dm increase, a voltage difference between adjacent output nodes N1–Nm may decrease in proportion to the number of voltage levels at the output nodes N1–Nm within a voltage range. Thus, the supply voltage Vk may be detected more accurately by increasing the number of voltage detecting portions D1–Dm.

In another exemplary embodiment of the present invention, the plurality of voltage detecting portions D1–Dm may further include a plurality of diodes DIO1–DIOm, respectively. Each of the diodes DIO1–DIOm may be placed between the supply voltage Vk and one of the resistors R1A–RmA. If the supply voltage Vk is less than offset voltages of the diodes DIO1–DIOm, the supply voltage Vk may not be transferred to the resistors R1A–RmA, which may reduce power consumption.

In another exemplary embodiment of the present invention, each of the diodes DIO1–DIOm may be an NMOS diode. DIO1–DIOm may be constructed by connecting the gate and drain of a NMOS transistor together. In this exemplary embodiment, the supply voltage Vk may not be transferred to the resistors R1A–RmA when the supply voltage Vk is less than a threshold voltage of the respective NMOS transistors of DIO1–DIOm. The threshold voltage of the NMOS diode may become the offset voltage of each of the diodes DIO1–DIOm, respectively. Thus, the diode offset voltage may be adjusted by varying the threshold voltage of the NMOS diode.

In another exemplary embodiment of the present invention, it may be assumed that in voltage detecting portion Dm of supply voltage measuring unit MEAm the resistance of a resistor between the output node Nm and the supply voltage Vk is RmA, the resistance of a resistor between the output node Nm and the ground voltage GNDm is Rm, the supply voltage is Vk, and the threshold voltage of the NMOS diode is Vt, a voltage at the output node Nm may be given by Equation 4:

$$V_{Nm} = \frac{(Vk - Vt) \times Rm}{RmA + Rm} \quad (4)$$

In another exemplary embodiment of the present invention, the supply voltage Vk may be reduced by the threshold voltage Vt of the NMOS diode DIOm when the NMOS diode DIOm is included in the voltage detecting portion Dm relative to when the NMOS diode DIOm is not included in the voltage detecting portion Dm. Further, this is similarly the case with respect to output nodes N1–Nm-1 and their respective NMOS diodes DIO1–DIOm-1, so each supply voltage Vk may be reduced by the threshold voltage Vt with each of the NMOS diodes DIO1–DIOm-1.

In another exemplary embodiment of the present invention, the plurality of voltage detecting portions D1–Dm may further include switching elements S1–Sm activated by detection start signals MRS1–MRSm, respectively, as illustrated in FIG. 3A. Each of the switching elements S1–Sm may be placed between respective ground voltages Gnd1–Gndm and respective resistors R1–Rm connected between output nodes N1–Nm and the respective ground voltage terminals Gnd1–Gndm. If the detection start signals MRS1–MRSm are not applied, the resistors R1–Rm may not be electrically connected with the ground voltage SGND1–GNDm when the supply voltage Vk is applied. In this manner, leakage current may be inhibited from flowing into the ground voltage Gnd1–Gndm.

In another exemplary embodiment of the present invention, each of the switching elements S1–Sm may be formed with an NMOS transistor.

In another exemplary embodiment of the present invention, the first voltage latching portion L1 may be activated when the voltage at the first output node N1 receives and latches the output of the first voltage detecting portion D1. The first voltage reading portion READ1 may receive the output of the first voltage latching portion L1.

In another exemplary embodiment of the present invention, as shown in FIG. 3B, the first voltage latching portion L1 may include a transmission gate T1 and inverter latches I12, I13, and I14. The transmission gate T1 may be activated by the voltage at the first output node N1, and may receive the output of the first voltage detecting portion D1. The received output of the first voltage detecting portion D1 may be latched to the states of inverter latches I12, I13, and I14. When the voltage at the first output node is applied to the first voltage latching portion L1, an inverter I11 may sense that the voltage at the first output node N1 is in a first state if the voltage is higher than a threshold voltage. When the voltage at the first output node N1 is above the threshold voltage, the transmission gate T1 may be activated. The voltage at the first output node N1 may be transmitted in the first state to the inverter latches I12, I13, and I14. The inverter latches I12, I13 and I14 may maintain, or latch, the voltage at the first output node N1 in the first state.

In another exemplary embodiment of the present invention, if the voltage at the first output node N1 is less than the threshold voltage, the inverter I11 may sense that the voltage is in a second state. When the inverter I11 senses that the voltage at the first output node N1 is less than the threshold voltage, the transmission gate T1 may not be activated. Thus, the voltage at the first output node N1 may not be transmitted to the inverter latches I12, I13 and I14, and instead the inverter latches I12, I13 and I14 may maintain their voltage level.

In another exemplary embodiment of the present invention, the voltage latching portions L2–Lm may be activated by voltages at respective output nodes N2–Nm, which receive the outputs of respective voltage detecting portions D2–Dm and may maintain the states of the outputs of the respective voltage detecting portions D2–Dm. The voltage reading portions READ2 to READm may receive the outputs of the respective voltage latching portions L2–Lm.

In another exemplary embodiment of the present invention, the voltage latching portions L2–Lm may include transmission gates T2–Tm and inverter latches I22–Im4, as illustrated in FIG. 3B. If voltages at the output nodes N2–Nm are higher than a threshold voltage, then inverters I22–Im4 may sense that the voltages of the output nodes N2–Nm are in the first state, which may allow the transmission gates T2–Tm to be activated. The voltages at the output nodes N2–Nm may be transmitted in first states to the inverter latches I22–I24, Im2–Im4. The inverter latches may maintain the voltages at the output nodes N2–Nm in first states.

In another exemplary embodiment of the present invention, if the voltages at the output nodes N2–Nm are less than the threshold voltage, the inverters I21, I31–Im1 may sense that the voltages are in the second state, so the transmission gates T2–Tm may not be activated. The voltages at the output nodes N2–Nm may not be transmitted to the inverter latches I22/I23/I24, I32/I33/I34, . . . , Im2/Im3/Im4 so that the inverter latches I22/I23/I24, I32/I33/I34, . . . , Im2/Im3/Im4 may maintain their previous voltage levels, respectively.

In another exemplary embodiment of the present invention, when the maximum voltage of a plurality of burn-in stress voltages is applied as the supply voltage, the voltages at the output nodes N1–Nm may reach a maximum voltage level, so that the number of voltage latching portions L1–Lm activated becomes a maximum number. The voltage latching portions L1–Lm may maintain the voltages at the respective output nodes N2–Nm in the first state. Thus, the maximum voltage may be maintained at the voltage latching portions L1–Lm.

In another exemplary embodiment of the present invention, the voltage latching portions L1–Lm may further include initializers INIT1–INITm that may transfer the ground voltages Gnd1–Gndm, respectively, as illustrated in FIG. 3B. When an initialization signal PVCCH is applied to the initializers INIT1–INITm, the initializers INIT1–INITm may be activated to electrically connect input terminals of the inverter latches I22/I23/I24, I32/I33/I34, . . . , Im2/Im3/Im4 with the ground voltage terminals Gnd1–Gndm, respectively. This may allow the input terminals of the inverter latches I22/I23/I24, I32/I33/I34, . . . , Im2/Im3/Im4 to be maintained at the second state. latching portions L2–Lm and may output the received outputs of respective voltage latching portions L2–Lm as output signals Dout2–Doutm, respectively. If the inverter latches I22/I23/I24, I32/I33/I34, . . . , Im2/Im3/Im4 of the voltage latching portions L2–Lm are maintained at the first state, the respective voltage reading portions READ2–READm may output in the first state.

In another exemplary embodiment of the present invention, the voltage reading portions R2–Rm may receive the outputs of respective voltage latching portions L2–Lm and may output the received outputs of respective voltage latching portions L2–Lm as output signals Dout2–Doutm, respectively. If the inverter latches I22/I23/I24, I32/I33/I34, . . . , Im2/Im3/Im4 of the voltage latching portions L2–Lm are maintained at the second state, the respective voltage reading portions READ2–READm may output the second state.

In another exemplary embodiment of the present invention, the supply voltage Vk may be calculated based on the output signals Dout1–Doutm from the voltage reading portions READ1–READm. The supply voltage Vk may be calculated in order to acquire the maximum voltage of the plurality of burn-in stress voltages.

In another exemplary embodiment of the present invention, voltage reading portions READ1–READm may be activated by a read start signal MRS_Read as illustrated in FIG. 3B. The output signals Dout1–Doutm of the voltage reading portions READ1–Readm may be determined by a logical AND operation on the read start signals MRS_Read and the output signals of the inverter latches I22/I23/I24, I32/I33/I34, . . . , Im2/Im3/Im4 of the voltage latching portions L1–Lm, respectively.

In another exemplary embodiment of the present invention, if the read start signal MRS_Read is not applied, the output signals Dout1–Doutm of the voltage reading portions READ1–READm may be maintained at the second state.

In another exemplary embodiment of the present invention, if the read start signal MRS_Read is applied, the output signals of the inverter latches I22/I23/I24, I32/I33/I34, . . . , Im2/Im3/Im4 of the voltage latching portions L1–Lm may be the output signals Dout1–Doutm of the voltage portions READ1–READm, respectively.

In another exemplary embodiment of the present invention, the voltage reading portions READ1–READm may be activated by the read start signal MRS_Read. The output signals of the inverter latches I22/I23/I24, I32/I33/I34, . . . , Im2/Im3/Im4 of the voltage latching portions L1–Lm may be the output signals Dout1–Doutm of the voltage reading portions READ1–READm, respectively. In this exemplary embodiment, the output signals of the inverter latches I22/

I23/I24, I32/I33/I34, . . . , Im2/Im3/Im4 of the voltage latching portions L1–Lm may only be active when the read start signal MRS_Read is applied. In this manner, power consumption may be reduced as the output signals from the inverter latches may not be active at all times.

In an exemplary embodiment of the present invention, it may be determined whether a defect in the semiconductor device is caused due to degradation of devices, progression of initial defects, a punch-through breakdown, and/or gate oxide rupture occurring when a burn-in stress voltage above a threshold voltage is applied to a MOSFET of a semiconductor device.

For example, when above-described exemplary embodiments of the present invention determine a maximum voltage being above a first threshold voltage, wherein voltages above the first threshold voltage may cause a punch-through effect, it may be determined that the defect in the semiconductor device may be caused by the punch-through effect. In another example, when above-described exemplary embodiments of the present invention determine a maximum voltage being above a second threshold voltage, wherein voltages above the second threshold voltage may cause a gate oxide rupture, it may be determined that the defect in the semiconductor device may be caused by the gate oxide rupture.

The exemplary embodiments of the present invention being thus described, it will be obvious that the same may be varied in many ways. For example, the first state may correspond to a low voltage level, and the second state may correspond to a high voltage level, or vice versa.

Such variations are not to be regarded as departure from the spirit and scope of the exemplary embodiments of the present invention, and all such modifications as would be obvious to one skilled in the art are intended to be included within the scope of the following claims.

What is claimed is:

1. A device for measuring voltage, comprising:
   a supply voltage;
   a ground voltage; and
   first and second supply voltage measuring units connected in parallel to each other between the supply voltage and the ground voltage, the first voltage measuring unit including a first voltage detecting portion, a first voltage latching portion and a first voltage reading portion that reads an output of the first voltage latching portion.

2. The device of claim 1, wherein the first voltage detecting portion further comprises:
   a first resistor connected between the supply voltage and a first output node; and
   a second resistor connected between the first output node and the ground voltage.

3. The device of claim 1, wherein the first voltage latching portion is activated by the voltage at a first output node, receives the output from the first voltage detecting portion, and maintains the received output from the first voltage detecting portion.

4. The device of claim 1, wherein the second supply voltage measuring unit comprises:
   a second voltage detecting portion;
   a second voltage latching portion; and
   a second voltage reading portion that reads the output of the second voltage latching portion.

5. The device of claim 4, wherein the second voltage latching portion is activated by the voltage at a second output node, receives the output from the second voltage detecting portion, and maintains the received output from the second voltage detecting portion.

6. The device of claim 4, wherein the second voltage detecting portion further comprises:
   a third resistor connected between the supply voltage and a second output node; and
   a fourth resistor connected between the second output node and the ground voltage.

7. The device of claim 4, wherein a first resistance ratio of the first voltage detecting portion is different from a second resistance ratio of the second voltage detecting portion.

8. The device of claim 4, wherein the second voltage detecting portion further comprises a diode between the supply voltage and a resistor.

9. The device of claim 8, wherein the diode is an NMOS diode.

10. The device of claim 9, wherein the diode is formed by connecting of a gate and a drain of a NMOS transistor together.

11. The device of claim 4, wherein the second voltage detecting portion further comprises a switching element which is activated by a detection start signal.

12. The device of claim 11, wherein the switching element includes at least one NMOS transistor.

13. The device of claim 4, wherein the second voltage latching portion latches the ground voltage.

14. The device of claim 4, wherein the second voltage reading portion is activated by a read start signal.

15. The device of claim 1, further comprising m, where m is an integer ≧1, supply voltage measuring units connected in parallel to the first and second supply voltage measuring units.

16. The device of claim 15, wherein the m supply voltage measuring units each comprise a voltage detecting portion, a voltage latching portion, and a voltage reading portion.

17. The device of claim 16, wherein resistance ratios in each of the voltage detecting portions of the m supply voltage measuring units are not identical.

18. The device of claim 1, wherein the first voltage detecting portion further comprises a diode between the supply voltage and a first resistor in the first voltage detecting portion.

19. The device of claim 18, wherein the diode is an NMOS diode.

20. The device of claim 19, wherein the diode is formed by connecting a gate and a drain of a NMOS transistor together.

21. The device of claim 1, wherein the first voltage detecting portion further comprises a switching element which is activated by a detection start signal.

22. The device of claim 21, wherein the switching element includes at least one NMOS transistor.

23. The device of claim 1, wherein the first voltage latching portion latches the ground voltage.

24. The device of claim 1, wherein the first voltage reading portion is activated by a read start signal.

* * * * *